(12) United States Patent
Peng et al.

(10) Patent No.: US 8,363,414 B2
(45) Date of Patent: Jan. 29, 2013

(54) SERVER SYSTEM

(75) Inventors: Wen-Tang Peng, Taipei Hsien (TW); Jun-Xiong Zhang, Shenzhen (CN); Jie Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 281 days.

(21) Appl. No.: 12/860,676

(22) Filed: Aug. 20, 2010

(65) Prior Publication Data

US 2011/0248612 A1    Oct. 13, 2011

(30) Foreign Application Priority Data

Apr. 9, 2010    (CN) .......................... 2010 1 0143514

(51) Int. Cl.
  *H05K 5/00*    (2006.01)
  *H05K 7/16*    (2006.01)
  *H05K 7/00*    (2006.01)
  *A47B 81/00*   (2006.01)

(52) U.S. Cl. ........ 361/724; 361/725; 361/726; 361/727; 361/732; 312/223.1; 312/223.2; 312/223.3

(58) Field of Classification Search .. 361/679.31–679.4, 361/679.55–679.6, 724–727; 439/157, 60, 439/152–153, 327, 328, 331; 312/223.1, 312/223.2
See application file for complete search history.

(56) References Cited

U.S. PATENT DOCUMENTS

2005/0185370 A1*  8/2005  Chung ........................ 361/683
2007/0128506 A1*  6/2007  Hsu et al. .................... 429/97
2008/0253077 A1* 10/2008  Miyamoto et al. .......... 361/685

* cited by examiner

*Primary Examiner* — Jayprakash N Gandhi
*Assistant Examiner* — Jerry Wu
(74) *Attorney, Agent, or Firm* — Altis Law Group, Inc.

(57) ABSTRACT

A server system includes a chassis, a first cover, and a second cover. The chassis defines an opening. The first cover is secured to the chassis and defines a recess for receiving a disk drive. The second cover is secured to the chassis. The first cover is rotatable between a first position, where the first and second covers cover the opening, and a second position, where the first cover is rotated away from the second cover. The recess is located outside the chassis when the first cover is in the first position.

15 Claims, 7 Drawing Sheets

SERVER SYSTEM

BACKGROUND

1. Technical Field

The present disclosure relates to a server system for conveniently checking, maintaining, or replacing electronic elements.

2. Description of Related Art

Usually, a plurality of electronic elements is secured in a server system. So, a server system which is convenient to check, maintain, or replace electronic elements is required.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
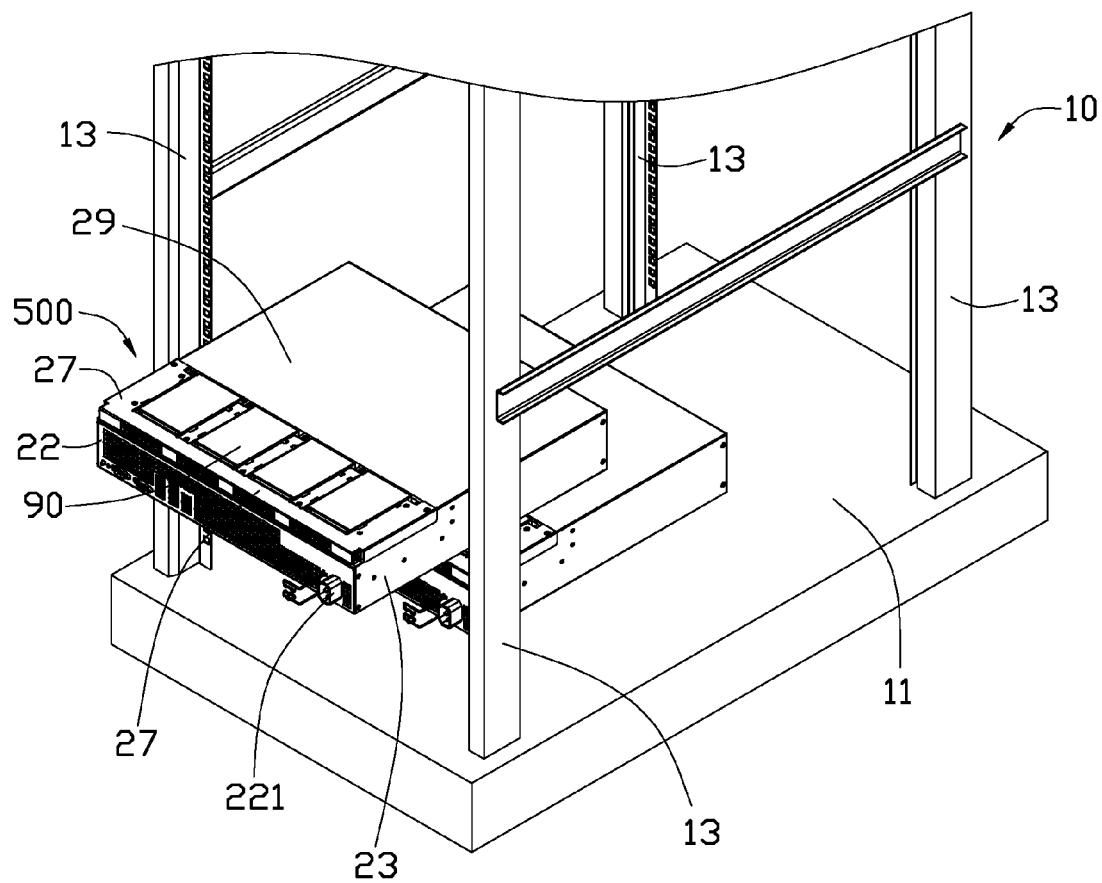
FIG. 1 is an assembled view of a server system in accordance with an embodiment.

Referring to FIG. 1, a server system in accordance with an embodiment includes a rack 10 and a plurality of hosts 500 (only two hosts 500 are shown in FIG. 1). The rack 10 includes a base 11 and four supports 13 secured to the base 11. In one embodiment, the supports 13 are substantially perpendicular to a top surface of the base 11.

Figure 2:
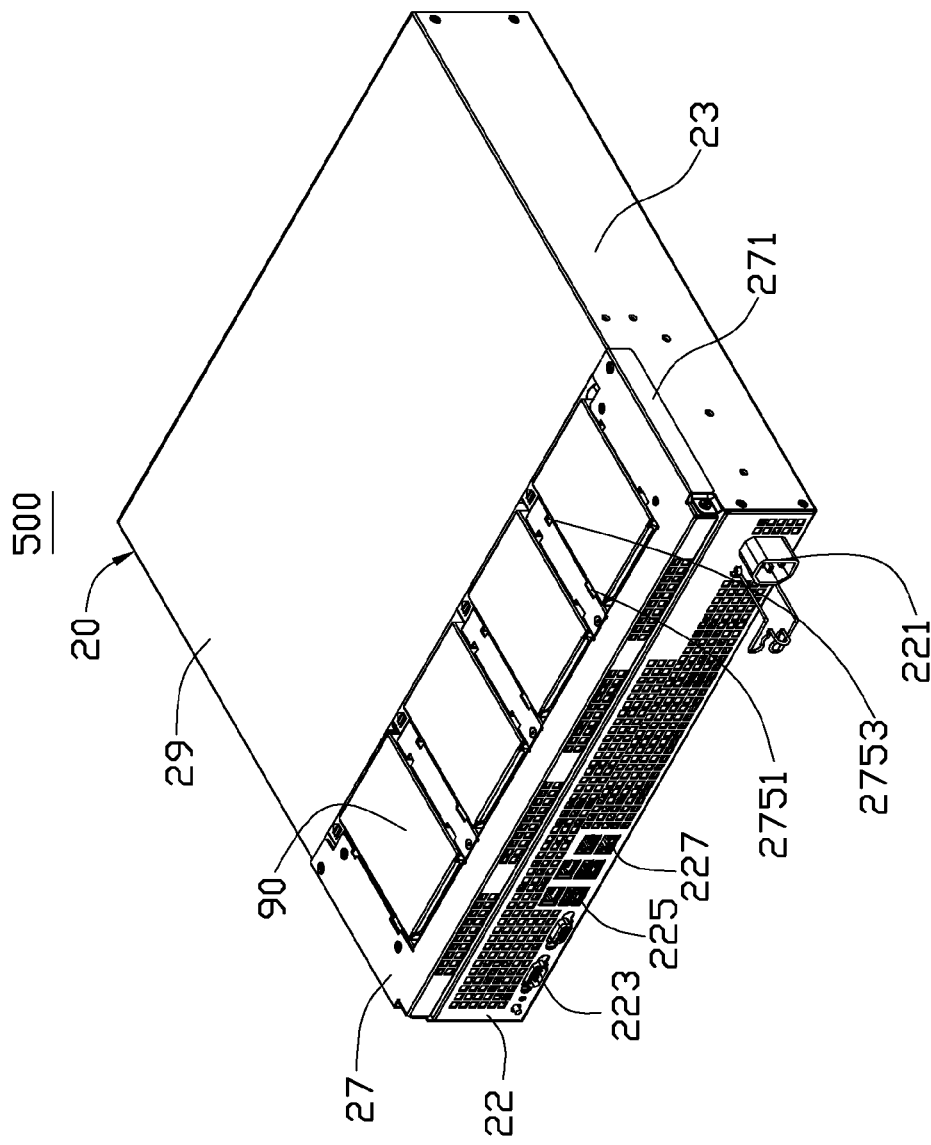
FIG. 2 is an assembled view of a host of FIG. 1.
Figure 3:
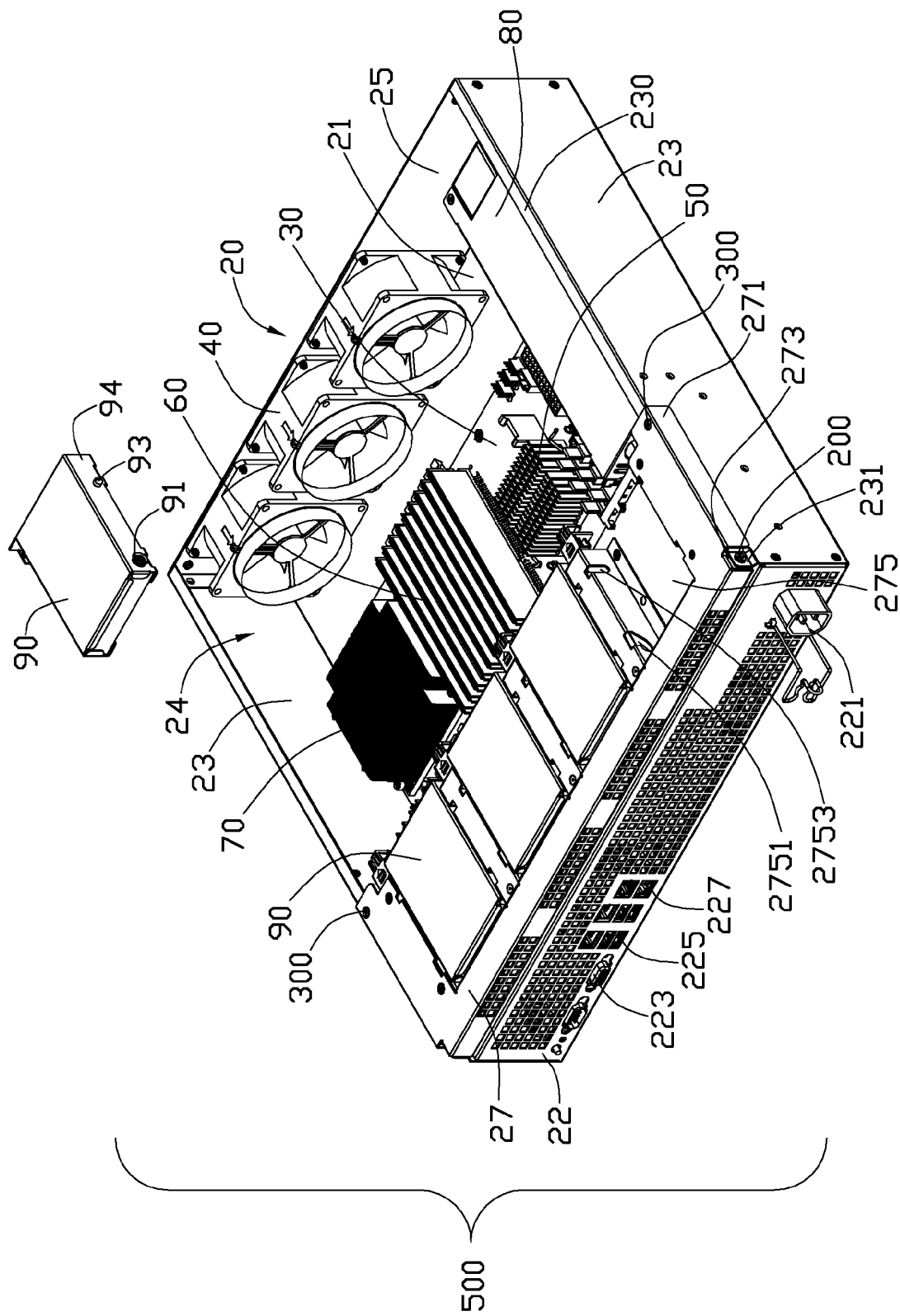
FIG. 3 is a partially exploded view of the host, and a second cover is not shown.

Referring to FIGS. 2-3, the host 500 is configured to be secured to the supports 13 and includes a chassis 20. The chassis 20 includes a bottom plate 21, a front plate 22, two opposite side plates 23, a rear plate 25, a first cover 27, and a second cover 29. The front plate 22, the side plates 23 and the rear plate 25 are located on the bottom plate 21. The side plates 23 are connected between the front plate 22 and the rear plate 25. An opening 24 is enclosed by the front plate 22, the side plates 23 and the rear plate 25. In one embodiment, the front plate 22, the side plates 23 and the rear plate 25 are substantially perpendicular to the bottom plate 21, and the side plates 23 are substantially perpendicular to the front plate 22 and the rear plate 25. The first and second covers 27, 29 are used to cover the opening 24.

A motherboard 30 is secured to the bottom plate 21. A first heat sink 50 and a second heat sink 70 are located on the motherboard 30, for cooling chips (not shown) such as CPUS. A plurality of memory cards 60 are engaged in sockets (not labeled), which are located on the motherboard 30. In one embodiment, the memory cards 60 are substantially parallel to the side plates 23.

A plurality of first connectors 223, second connectors 225 and third connectors 227 are located on the front plate 22, adjacent one side plate 23. A power connector 221 is located on the front plate 22, adjacent another side plate 23. The first to third connectors 223, 225, 227, and the power connector 221 are electronically coupled to the motherboard 30.

Figure 5:
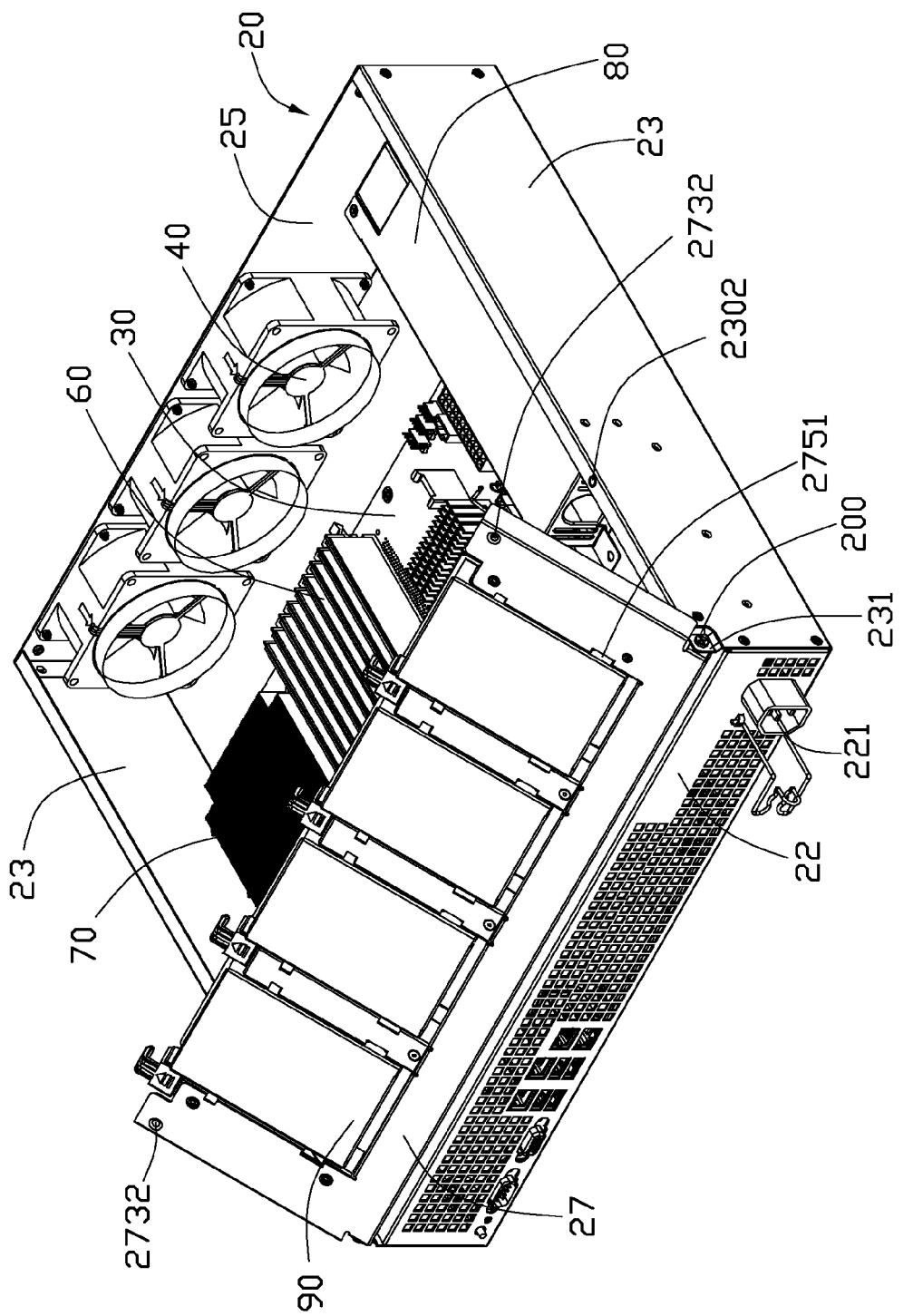
FIG. 5 is similar to FIG. 4, but shows a first cover in a different position.
Figure 6:
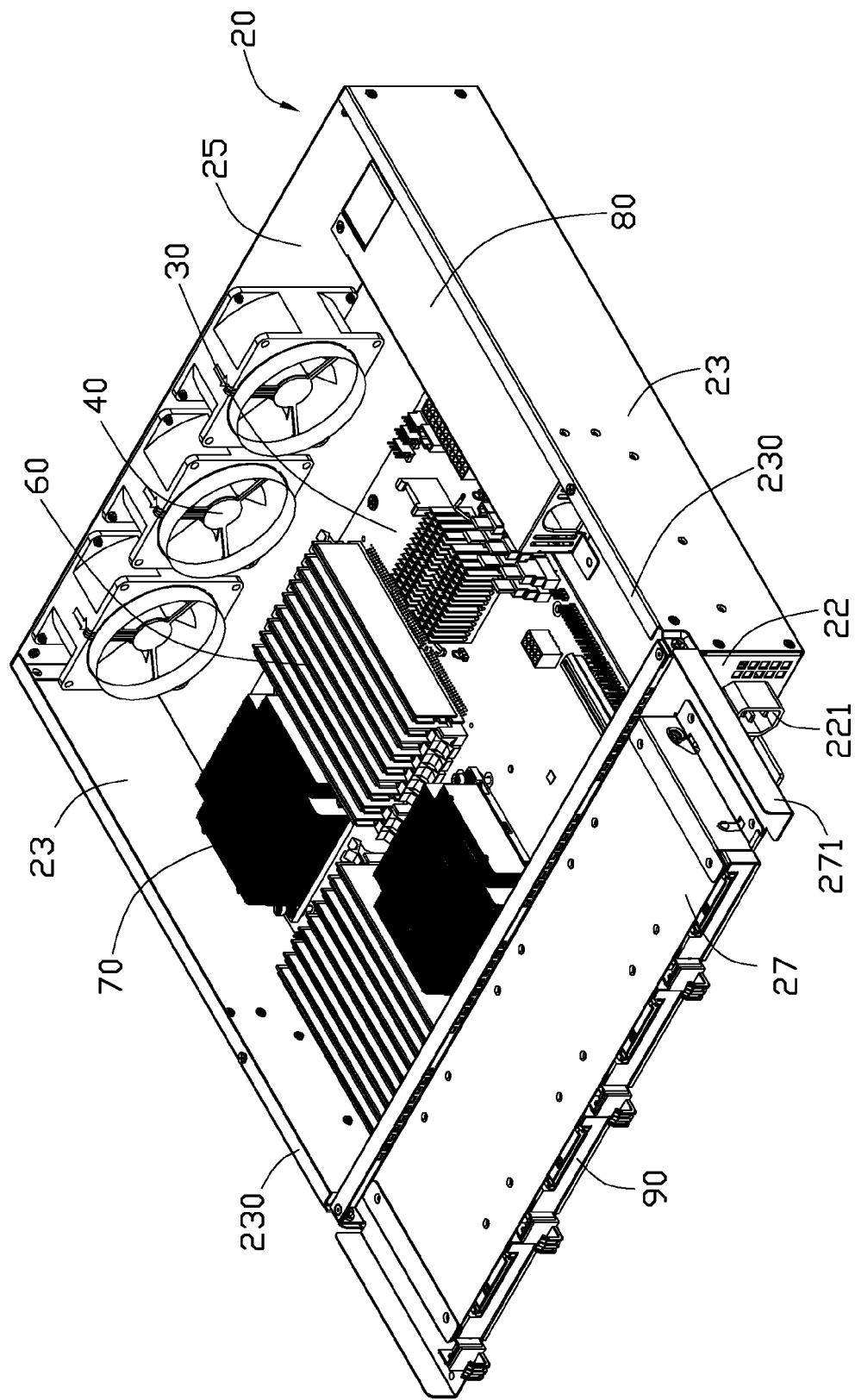
FIG. 6 is similar to FIG. 5, but shows the first cover in a different position.

A supporting flange 230 is located on a top edge of each side plate 23. A locking hole 2302 (shown in FIG. 5) is defined in each supporting flange 230. A securing piece 231 with a securing hole (not shown) is bent inward from an edge of each side plate 23, which is adjacent the front plate 22. A power supply bracket 80 is secured to one of the side plates 23, above the motherboard 30, but below the corresponding supporting flange 230, for receiving a power supply. A plurality of fans 40 is secured to the rear plate 25, above the motherboard 30.

Two positioning flanges 271 are bent down from opposite edges of the first cover 27. Two mounting pieces 273 each with a mounting hole (not shown) are located on the opposite edges of the first cover 27. Two through holes 2732 (shown in FIG. 5) are defined in the first cover 27, adjacent the two positioning flanges 271. A plurality of recesses 275 is defined in the first cover 27, for receiving disk drives 90. A first securing slot 2751 and a second securing slot 2753 are defined in each of opposite sides of each recess 275. In one embodiment, the first securing slot is substantially L-shaped, and the second securing slot 2753 extends in a vertical direction.

Referring to FIGS. 2-6, in assembly, the first cover 27 is placed on the chassis 20. The mounting pieces 273 are positioned between the securing pieces 231, with the mounting holes corresponding to the securing holes. Two first fasteners 200, such as screws, are engaged into the mounting holes and the securing holes, to rotatably secure the first cover 27 to the chassis 20. The second cover 29 is secured to the chassis 20 on the rear plate 25 and the side plates 23.

The first cover 27 can be rotated between a first position (shown in FIG. 2), where the first cover 27 is rotated to abut the side plates 23 of the chassis 20, and a second position (shown in FIG. 5), where the first cover 27 is rotated out of the chassis 20. In the first position, the first cover 27 and the second cover 29 together cover the opening 24 of the chassis 20.

When the first cover 27 is in the first position, the through holes 2732 of the first cover 27 is aligned with the locking holes 2302 of the side plates. Two second fasteners 300, such as screws, are screwed into the through holes 2732 and the locking holes 2302, to stably secure the first cover 27 to the side plates 23 of the chassis 20. In one embodiment, the first cover 27 is engaged with the second cover 29 when in the first position.

Figure 4:
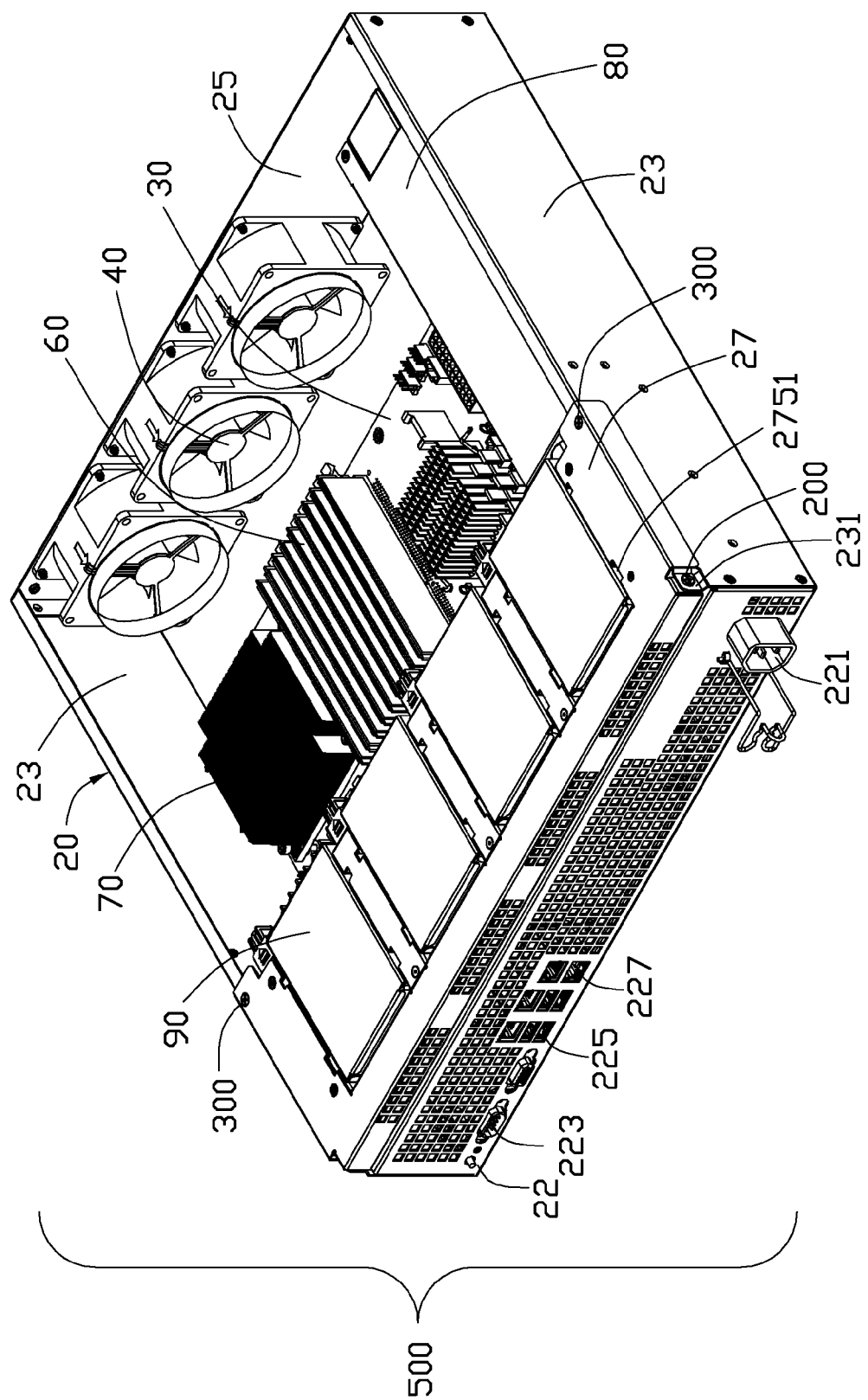
FIG. 4 is similar to FIG. 2, but the second cover is shown.

Referring to FIG. 3, each disk drive 90 includes two opposite sidewalls 94. A first positioning post 91 and a second positioning post 93 are located on each sidewall 94. Referring also to FIGS. 2 and 4, in assembly, the first positioning posts 91 of each disk drive 90 are engaged in the first securing slots 2751 of each recess 275, and the second positioning posts 93 of each disk drive 90 are engaged in the second securing slots 2753 of each recess 275. Therefore, the disk drives 90 are secured to the recesses 275 of the first cover 27, and can be rotated along with the first cover 27.

Figure 7:
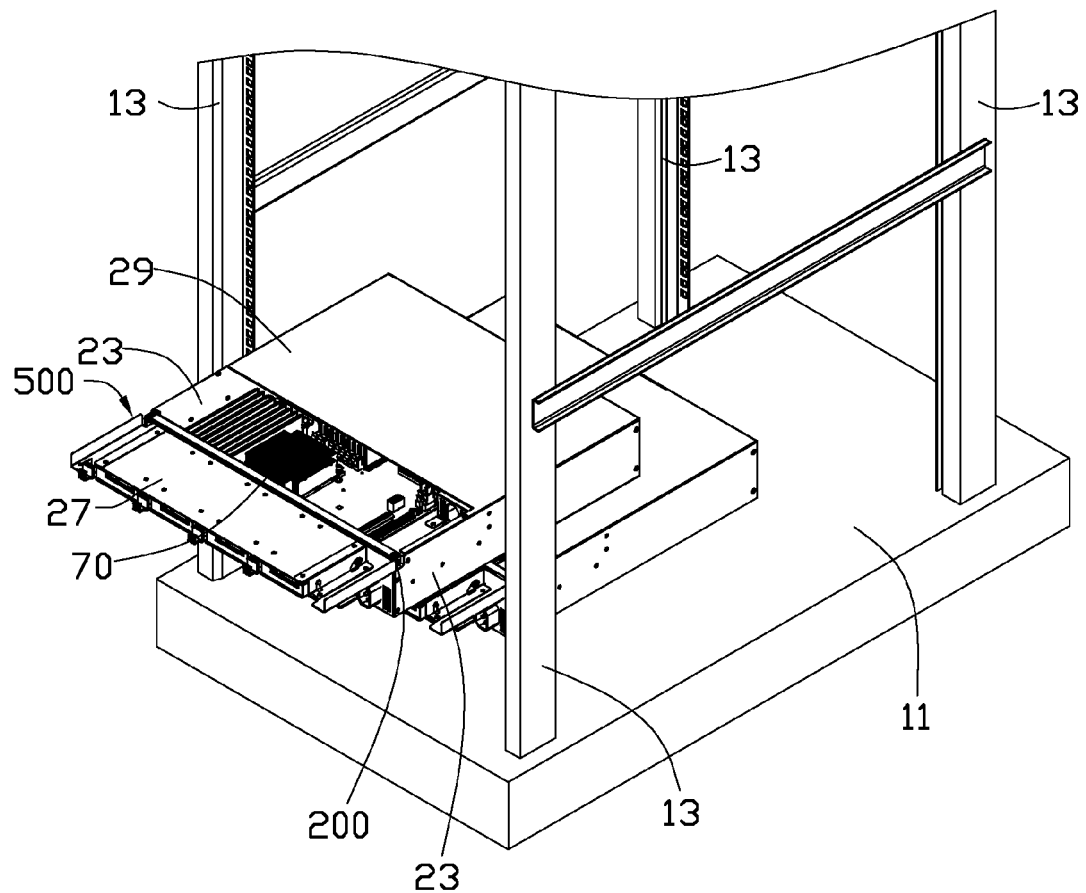
FIG. 7 is similar to FIG. 1, but shows the first cover in a different position.

Referring to FIGS. 1 and 7, the hosts 500 are secured to the rack 10, by known means, such as screws or rails. Since, the first cover 27 can be rotated from the first position to the second position, the server system is very convenient to check, maintain, or replace electronic elements, which are mounted in the chassis 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A server system comprising:
   a chassis defining an opening and comprising a bottom plate;
   a first cover secured to the chassis, a top surface of the first cover defining a recess for receiving a disk drive exposed from the top surface of the first cover; and a first end of the first cover is pivotably mounted to two opposite plates, a second end of the first cover is engaged with the second cover when the first cover is in the first position; and
   a second cover secured to the chassis and substantially parallel to the bottom plate;
   wherein the first cover is rotatable between a first position, where the first and second covers cover the opening, and the first cover is substantially parallel to the bottom plate; and a second position, where the first cover is rotated away from the second cover, and the first cover is substantially parallel to the bottom plate; and the first cover with the recess is located outside the chassis when the first cover is in the second position.

2. The server system of claim 1, wherein two positioning flanges are located on the first cover; and the two opposite side plates are positioned between the two positioning flanges when the first cover is in the first position.

3. The server system of claim 1, wherein two securing pieces are located on the two opposite side plates; and two mounting pieces are located on the first cover and pivotably secured to the two securing pieces.

4. The server system of claim 3, wherein the two mounting pieces are positioned between the two securing pieces.

5. The server system of claim 1, wherein the chassis further comprises a front plate connected to the two opposite side plates; and the first cover abuts the front plate and the two opposite side plates when the first cover is in the first position.

6. The server system of claim 5, wherein the chassis further comprises a rear plate connected to the two opposite side plates; and the second cover is secured to the rear plate and the two opposite side plates.

7. The server system of claim 6, wherein the two opposite side plates are substantially perpendicular to the front plate and the rear plate.

8. A server system comprising:
   a chassis defining an opening and comprising a bottom plate;
   a first cover pivotably secured to the chassis by a first end, a top surface of the first cover defining a recess for receiving a disk drive exposed from the top surface of the first cover; and a second cover secured to the chassis to cover a part of the opening, and the second cover is substantially parallel to the top surface of the first cover when the first cover covers rest of the opening;
   wherein the first cover is moved between a first position, where the first cover is engaged with the second cover to cover rest of the opening; and a second position, where an opposite second end of the first cover is disengaged from the second cover; and the first cover with the recess is located outside the chassis and substantially parallel to the bottom plate when the first cover is in the second position.

9. The server system of claim 8, wherein the chassis comprises two opposite side plates; and the first cover is pivotably secured to the two opposite side plates.

10. The server system of claim 9, wherein two positioning flanges are located on the first cover; and the two opposite side plates are positioned between the two positioning flanges when the first cover is in the first position.

11. The server system of claim 9, wherein two securing pieces are located on the two opposite side plates; and two mounting pieces are located on the first cover and moveably secured to the two securing pieces.

12. The server system of claim 11, wherein the two mounting pieces are positioned between the two securing pieces.

13. The server system of claim 9, wherein the chassis further comprises a front plate connected to the two opposite side plates; and the first cover abuts the front plate and the two opposite side plates when the first cover is in the first position.

14. The server system of claim 13, wherein the chassis further comprises a rear plate connected to the two opposite side plates; and the second cover is secured to the rear plate and the two opposite side plates; and the two opposite side plates are substantially perpendicular to the front plate and the rear plate.

15. The server system of claim 8, further comprising a rack, the chassis being secured to the rack.

* * * * *